US010049729B1

(12) United States Patent
Terzioglu et al.

(10) Patent No.: US 10,049,729 B1
(45) Date of Patent: Aug. 14, 2018

(54) FLEXIBLE MEMORY ASSISTANCE SCHEME

(71) Applicant: QUALCOMM Incorporated, San Diego, CA (US)

(72) Inventors: Esin Terzioglu, San Diego, CA (US); Sei Seung Yoon, San Diego, CA (US); Chulmin Jung, San Diego, CA (US); Bin Liang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/708,393

(22) Filed: Sep. 19, 2017

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
CPC .... G11C 29/021; G11C 11/5628; G11C 16/10
See application file for complete search history.

(56) References Cited

U.S. PATENT DOCUMENTS

| 6,259,629 | B1* | 7/2001 | Seki ................. G11C 16/06 365/185.18 |
| 7,881,137 | B2 | 2/2011 | Chen et al. |
| 7,903,483 | B2 | 3/2011 | Russell et al. |
| 9,105,315 | B2 | 8/2015 | Hold et al. |
| 9,306,563 | B2* | 4/2016 | Gondi ................... G11C 7/1057 |
| 9,330,751 | B2 | 5/2016 | Nagle et al. |
| 9,396,795 | B1 | 7/2016 | Jeloka et al. |
| 9,601,209 | B2* | 3/2017 | Kim ...................... G11C 16/26 |
| 2011/0255341 | A1* | 10/2011 | Jones ................. G11C 16/3454 365/185.19 |
| 2012/0218818 | A1* | 8/2012 | Han ..................... G11C 11/5628 365/185.03 |
| 2016/0225436 | A1* | 8/2016 | Wang ..................... G11C 11/417 |
| 2016/0275999 | A1* | 9/2016 | Chhabra ................ G11C 5/148 |

* cited by examiner

*Primary Examiner* — Tuan T Nguyen
(74) *Attorney, Agent, or Firm* — Arent Fox, LLP

(57) ABSTRACT

In an aspect of the disclosure, a method, a computer-readable medium, and an apparatus are provided. The apparatus may change a device operating voltage from a first voltage to a second voltage while the assist circuit is in a first state. The apparatus may also maintain the device operating voltage at the second voltage for a predetermined time. The apparatus may switch the assist circuit from the first state to a second state. The apparatus may adjust the device operating voltage to a third voltage after the predetermined time, wherein the second voltage is a voltage level between the first voltage and the third voltage. By transitioning the device operating voltage from the first voltage to the third voltage while at the same time preventing the assist circuit from entering particular read assist states, the apparatus may reduce a likelihood of read failures.

29 Claims, 11 Drawing Sheets

FLEXIBLE MEMORY ASSISTANCE SCHEME

BACKGROUND

Field

The present disclosure relates generally to integrated circuits, and more particularly, to a flexible memory assistance scheme and apparatuses incorporating the flexible memory assistance scheme.

Background

Integrated circuits (or "chips") have revolutionized the electronic industry by enabling complex circuits consisting of millions of transistors, diodes, resistors and capacitors to be integrated into a chip of semiconductor material. Integration also provides other benefits such as batch manufacturing. The simultaneous manufacture of hundreds or even thousands of integrated circuits onto a single semiconductor wafer reduces cost and increases reliability of the end products.

Despite the manufacturing benefits of integrated circuits, process variations during the manufacturing process may have an impact on the electrical parameters of the chips, thereby leading to variations in performance. Statistically, most of the chips manufactured on a semiconductor wafer will have electrical parameters that meet the nominal design specifications. A number of chips, however, will deviate from the nominal case which may result in lower chip yield.

Memory is a common circuit implemented within an integrated circuit. A static random access memory (SRAM) is just one example of memory. The SRAM is a memory that requires power to retain data. Unlike dynamic random access memory (DRAM), SRAM does not need to be periodically refreshed. SRAM also provides faster access to data than DRAM making SRAM an attractive choice for many integrated circuit applications. Due to manufacturing deviations, read assist circuitry for memory cells or bitcells of the SRAM may be desirable to reduce read errors over a wider variation in power supply voltage levels.

Different read assist techniques have been used in the past. Such techniques allow a reading of the memory cell or bitcell when a device operating voltage operates within a nominal voltage range. However, such techniques often fail to address issues related to read errors (e.g., bits flipping state during a read operation or bitcells not being sensed correctly by a sense amplifier) when the read assist techniques are operating at particular device operating voltages. Accordingly, there is a need for new techniques and methods that provide read assist techniques for memory to reduce read errors when in the particular device operating voltages.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may change a device operating voltage from a first voltage to a second voltage while the assist circuit is in a first state. The apparatus may also maintain the device operating voltage at the second voltage for a predetermined time. The apparatus may switch the assist circuit from the first state to a second state. The apparatus may adjust the device operating voltage to a third voltage after the predetermined time, wherein the second voltage is a voltage level between the first voltage and the third voltage. By transitioning the device operating voltage from the first voltage to the third voltage while at the same time preventing the assist circuit from entering particular read assist states, an apparatus may reduce a likelihood of read failures occurring when the apparatus is in the low power mode or the high power mode. Further, in doing so, the memory of the apparatus may function over a greater range of voltages with a reduced likelihood of read failures.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
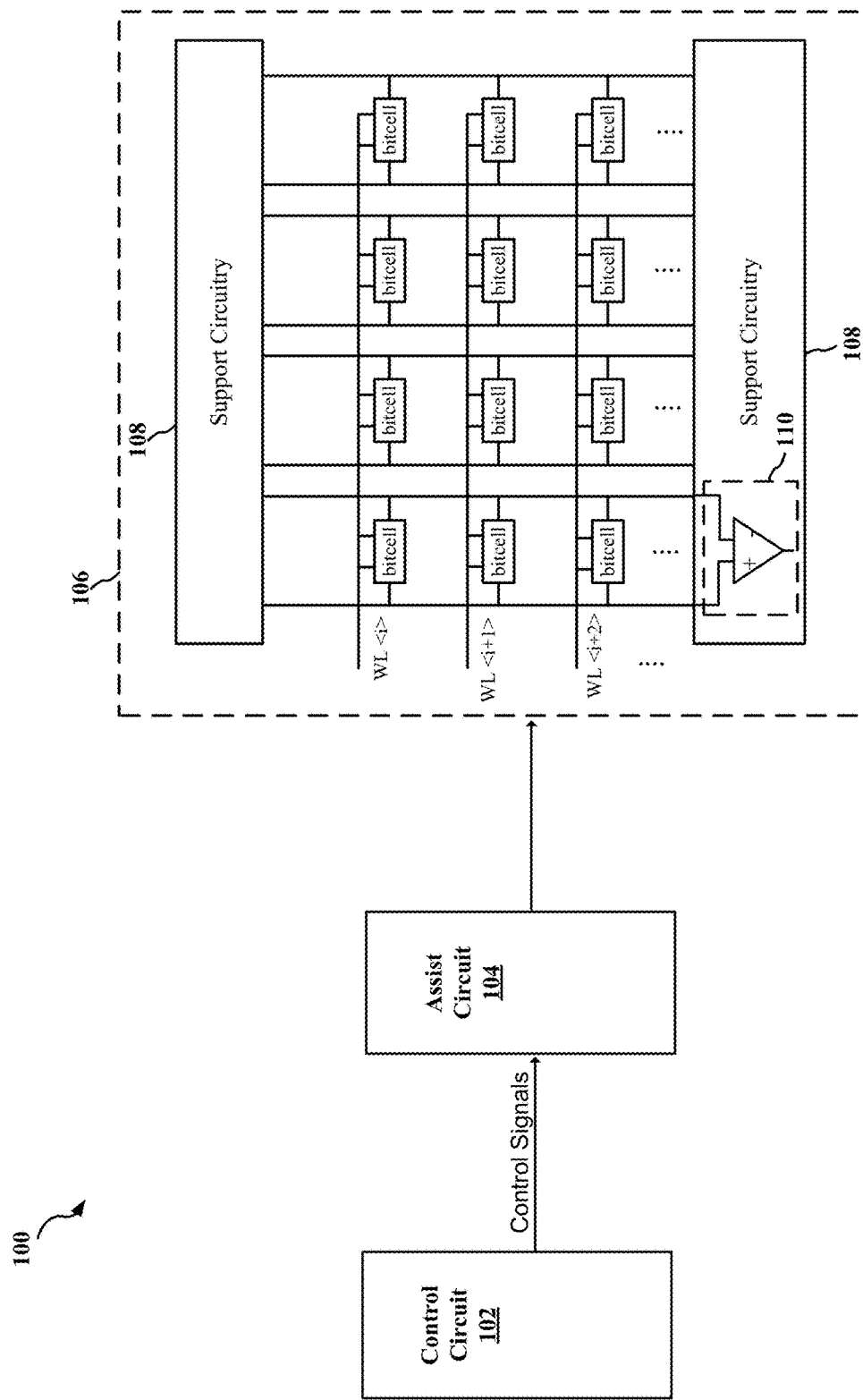
FIG. 1 is a functional block diagram illustrating an example of an integrated circuit.

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art.

Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the figures and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, or as part of the design of an integrated circuit. The integrated circuit may be an end product, such as a microprocessor, a digital signal processor (DSP), an application specific integrated circuit (ASIC), programmable logic, memory, or any other suitable integrated circuitry. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), laptop computer, a desktop computer (PC), a computer peripheral device, a multimedia device, a video device, an audio device, a global positioning system (GPS), a wireless sensor, an Internet of Things device, or any other suitable device.

FIG. 1 is a functional block diagram illustrating one example of an integrated circuit 100. The integrated circuit 100 is shown with a control circuit 102 coupled to an assist circuit 104 that is coupled to a memory 106. The control circuit 102 may provide control of the assist circuit 104, and also provide other functions for controlling the memory 106, such as word line (WL) address decoding, write enable, output enable, etc. Examples of the control circuit 102 may include a processor and/or control logic circuits configured to provide control signals to the assist circuit 104 and/or the memory 106. The assist circuit 104 may provide assistance to the memory 106 during read operations to provide an increased voltage difference between the WL voltage and a bitcell supply voltage, as will be discussed in further detail below. An example of the memory 106 may include static random access memory (SRAM). The memory 106 may include an array of bitcells. The array may be arranged in rows and columns of bitcells. Further, the memory 106 may include support circuitry 108 that may include sense amplifiers 110, precharge circuits, address decoders, read muxes, write drivers, or any other circuitry for performing read and write operations. Each row of the bitcells has a word line (WL) (e.g., WL <i>, WL <i+1>, WL <i+2>, etc.) Two complimentary bitlines may be attached to each column of bitcells. Each bitcell has a unique location or address defined by the intersection of a row and column. The number of bitcells may be determined by a variety of factors including the size of the memory 106, the speed requirements of the memory 106, the layout and testing requirements, and the like. The array may include thousands of bitcells.

In the following detailed description, various aspects of an integrated circuit will be presented in the context of a read assist circuit in combination with memory, such as an SRAM. While such aspects may be well suited for SRAM, those skilled in the art will realize that these aspects may be extended to other forms of hardware. By way of example, various aspects presented throughout this disclosure may be applied to read and/or write assist for random access memory (RAM), static RAM (SRAM), double data rate RAM (DDRAM), cache, shift registers, register files, buffers, and other suitable memories. Accordingly, any reference to memory in this disclosure is intended only to illustrate various concepts, with the understanding that such concepts may have a wide range of applications.

Figure 2:
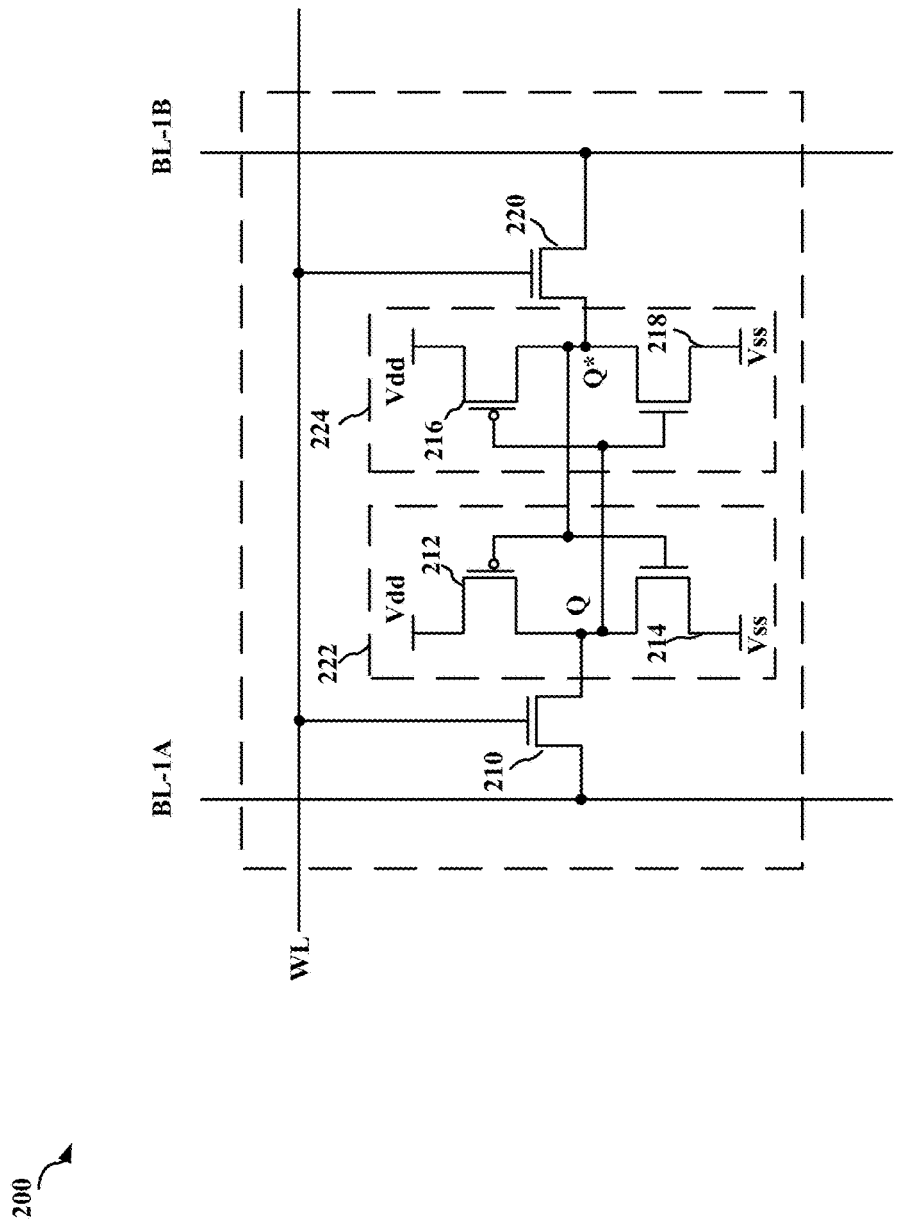
FIG. 2 is a schematic representation illustrating an example of a bitcell for a memory.

FIG. 2 is a schematic representation illustrating one example of a bitcell 200 for an SRAM (e.g., the memory 106). The bitcell 200, as shown, is implemented with a six-transistor (6T) configuration. However, as those skilled in the art will readily appreciate, the bitcell 200 may be implemented with other transistor configurations. The operation of the bitcell 200 will be described in connection with two logic states represented by two voltage bands: one near the supply voltage Vdd (also known as the device operating voltage) and one near the supply voltage return, Vss, which may be ground. The terms "high," "logic level 1," and "pulled-up" may be used to reference the band near the supply voltage Vdd. The terms "low," "logic level 0," and "pulled-down" may be used to reference the band near the supply voltage return Vss.

The bitcell 200 is shown with two inverters 222, 224. The first inverter 222 includes a p-channel pull-up transistor 212 and an n-channel pull-down transistor 214. The second inverter 224 includes a p-channel pull-up transistor 216 and an n-channel pull-down transistor 218. The first and second inverters 222, 224 are interconnected to form a cross-coupled latch. A first n-channel access transistor 210 couples the latch to a first bit-line BL-1A (or BL) and a second n-channel access transistor 220 couples the latch to a second bit-line BL-1B (or BLB). The gates of the n-channel access transistors 210, 220 are coupled to the WL. In the embodiments described herein, the read assist signal as discussed above with respect to FIG. 1 which may control the SRAM and may be, e.g., the WL.

A read operation is initiated by precharging both the bit-lines BL-1A, BL-1B to a logic level 1 and then asserting the WL. The WL is asserted by setting the WL high, thereby enabling both the access transistors 210, 220. With both the access transistors 210, 220 enabled, the value stored at the output Q of the first inverter 222 is transferred to the first bit-line BL-1A and the value stored at the output Q* of the second inverter 224 is transferred to the second bit-line BL-1B. By way of example, if the value stored at the output Q* is a logic level 0 and the value stored at the output Q is a logic level 1, the first bit-line BL-1A will remain in its pre-charged state, while the second bit-line BL-1B is pulled-down through the transistors 218, 220. If the value stored at the output Q* is a logic level 1 and the value stored at the output Q is a logic level 0, the first bit-line BL-1A is pulled-down through the transistors 214, 210 and the second bit-line BL-1B will remain in its pre-charged state. Either way, the bit-lines BL-1A, BL-1B are provided to a sense amplifier (e.g., 110) which senses which line has the higher voltage to determine the state of the bitcell 200.

When the word line WL is not asserted (e.g., a logic level 0), the access transistors 210, 220 disconnect the bit-lines BL-1A, BL-1B from the two inverters 222, 224. The output state of the bitcell 200 is maintained by the cross-coupling between the two inverters 222, 224.

In some situations, read errors may occur when a read operation occurs. Examples of a read error may include a bitcell not being sensed correctly by a sense amplifier. As described above, a sense amplifier (e.g., 110) determines the state of a bitcell based on the voltages on the bitlines during a read operation. In detail, the sense amplifier amplifies a margin of voltage difference between the bitlines and amplifies this voltage to a normal logic level. The margin of voltage difference is commonly known as the sense margin. However, in some situations, the sense margin may remain small and the sense amplifier may be unable to determine the correct state of the bitcell (e.g., due to offset voltage of the sense amp), which causes a read error. For example, if a voltage on BL-1A is at a logic level 1 and a voltage on BL-1B is within a logic level 1 minus the sense amp voltage offset, a read error would occur. A read error related to sense margins may occur when one of the bitlines has residual voltage from the WL being enabled.

Figure 3:
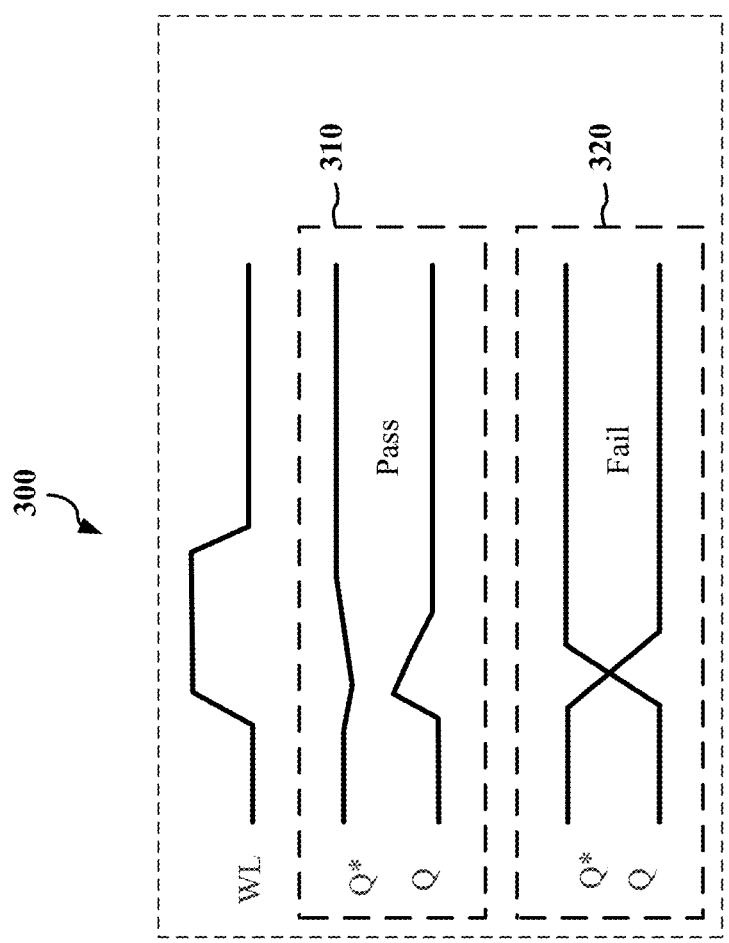
FIG. 3 is a timing diagram illustrating read operations performed by a bitcell.

Another example of a read error may include read stability error e.g. a bit within a bitcell flipping states during a read operation. An example of a read stability error is described in relation to FIG. 3. FIG. 3 is a timing diagram 300 illustrating read stability during a read operation performed on a bitcell 200. Using the example of the value stored at the output Q* being a logic level 1 and the value stored at the output Q being a logic level 0, when the WL is asserted by setting the WL high, a voltage on output Q may increase while a voltage on output Q* may decrease, as shown by diagram 310. The read operation is successful when the correct voltages stored at outputs Q and Q* are sensed by the sense amplifier. However, in some instances, a bitcell may not be stable and, as shown by diagram 320, the voltage on output Q may increase or output Q* may decrease past a threshold causing the stored bits to flip state thereby causing a read failure. In other words, when WL is enabled, a higher Vdd results in an increased charge applied to Q, which may cause the bitcell to flip states if WL is enabled for a sufficient time. Stability issues during a read operation may be a result of electrical characteristics of transistors in a bitcell, or multiple cells within the same column being activated and coupled to the bitline simultaneously. The risk of read stability issues increase as transistors used by bitcells become smaller and smaller in size.

To reduce read failures, assist circuits (e.g., assist circuit 104) may be used to generate an increased voltage difference between a WL voltage and a bitcell supply voltage, as described below. By maintaining the bitcell supply voltage above the WL voltage, the inverters 222, 224 may not be overpowered by a voltage on the bitline, thereby reducing the occurrence of read failures.

Figure 4:
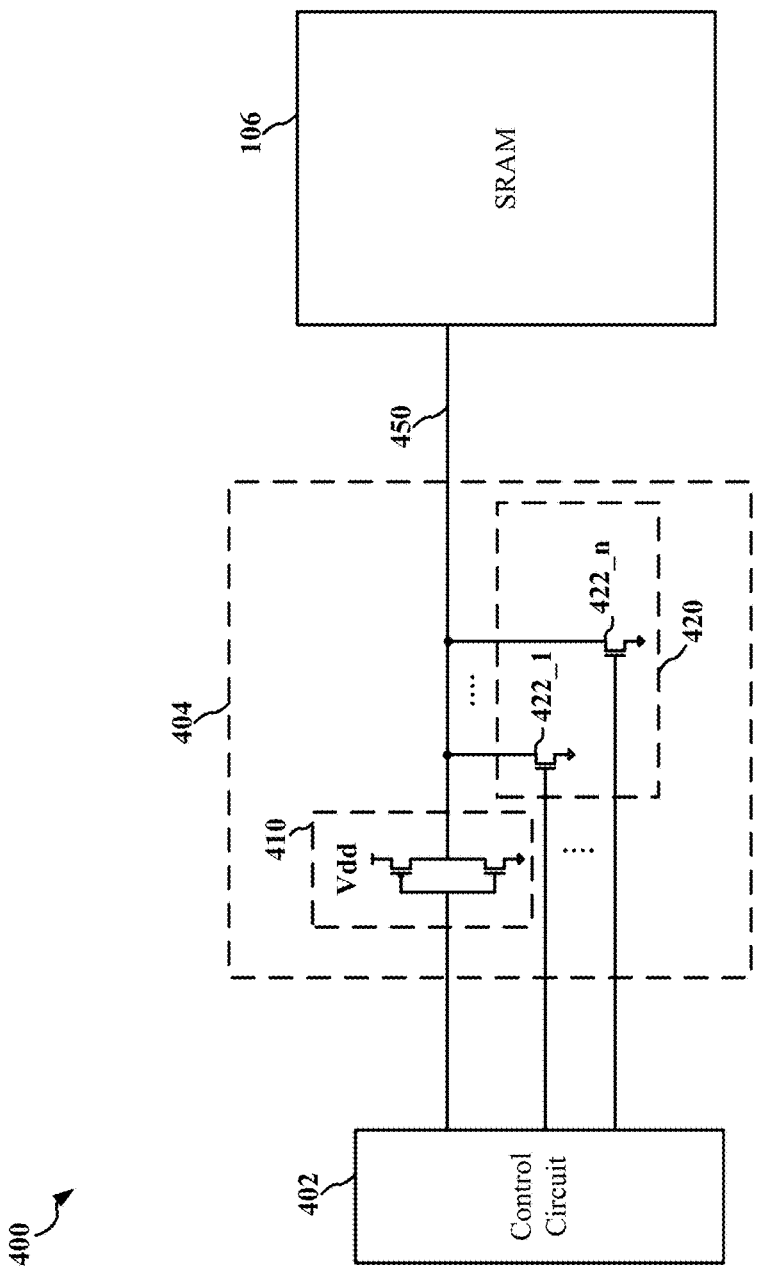
FIG. 4 is a functional block diagram illustrating an example of an integrated circuit.

FIG. 4 is a functional block diagram illustrating one example of an integrated circuit 400. The integrated circuit 400 may be an example of the integrated circuit 100 of FIG. 1. The integrated circuit 400 may include a control circuit 402 coupled to an assist circuit 404 that is coupled to the memory 106. The control circuit 402 may provide control logic to the assist circuit 404, and also provide other functions for controlling the memory 106, such as decoding WL, write enable, output enable, etc. Examples of the control circuit 402 may include the control circuit 102.

The assist circuit 404 may include a WL driver 410 configured to receive an address select signal corresponding to a bitcell from the array of bitcells in the memory 106 An output of the WL driver 410 may be coupled, at line 450, to a WL of memory 106. When enabled, the WL driver 410 may output a device power supply voltage Vdd, which is a same voltage for the bitcell supply line. To reduce the WL voltage level, the assist circuit 404 may also include a pull-down circuit 420 connected to the line 450. The pull-down circuit 412 may include a plurality of pull-down transistors $422\_1$-$422\_n$, where n may be any integer. Each of the pull-down transistors $422\_1$-$422\_n$ may be individually enabled by the control circuit 402 to pull-down the voltage output by the WL driver 410. Each of the pull-down transistors $422\_1$-$422\_n$ may be an re-channel transistor. However, those skilled in the art will readily appreciate that the pull-down transistors $422\_1$-$422\_n$ may be implemented with other transistor configurations such as p-channel transistors or any combination of n-channel and p-channel transistors.

When a pull-down transistor (e.g., any one of the pull-down transistors $422\_1$-$422\_n$) is enabled by the control circuit 402, the pull-down transistor may lower or pull-down a voltage on the line 450 (i.e., the WL voltage) by a predetermined voltage. The predetermined amount may be based on a respective size of the pull-down transistor. As more of the pull-down transistors $422\_1$-$422\_n$ are enabled, the voltage on line 450 is decreased from Vdd by a greater voltage amount. For example, if one pull-down transistor is enabled, the voltage on line 450 may decrease from Vdd by 0.5V, whereas if three pull-down transistors are enabled, the voltage on line 450 may decrease from Vdd by 1.5V. Because the voltage on line 450 is decreased to a lower voltage than the bitcell supply voltage (e.g., Vdd), the assist circuit 404 may reduce the occurrence of a read failure. In an example, each of the pull-down transistors $422\_1$-$422\_n$ may be significantly smaller than the transistors used by the WL driver 410. For example, each of the pull-down transistors $422\_1$-$422\_n$ may be 2 fins of a FinFET device in size and the transistors used by the WL driver 410 may be 42 fins in size. The size difference between the WL driver 410 and the pull-down transistors $422\_1$-$422\_n$ may allow a finer voltage resolution when lowering the voltage on line 450.

While the assist circuit 406 may reduce read failures in the integrated circuit 400 for a majority of read operations, there remains certain instances when read errors still occur. For example, as memory bit cells decrease in size, a high or maximum operating voltage (e.g., Vdd_max) may decrease. However, a higher Vdd enables a higher performance memory. Additionally, to conserve power when a device does not need maximum performance, the memory may be operated at low or minimum operating power (e.g., Vdd_min) to reduce leakage current. When a memory array is switched from high performance mode to low performance mode and remains operational during the switch, leaving the memory assist in a fixed state may result in read errors. Thus there is a need to be able to transition the read assist circuit from one state to another state during the Vdd transition.

Figure 5:
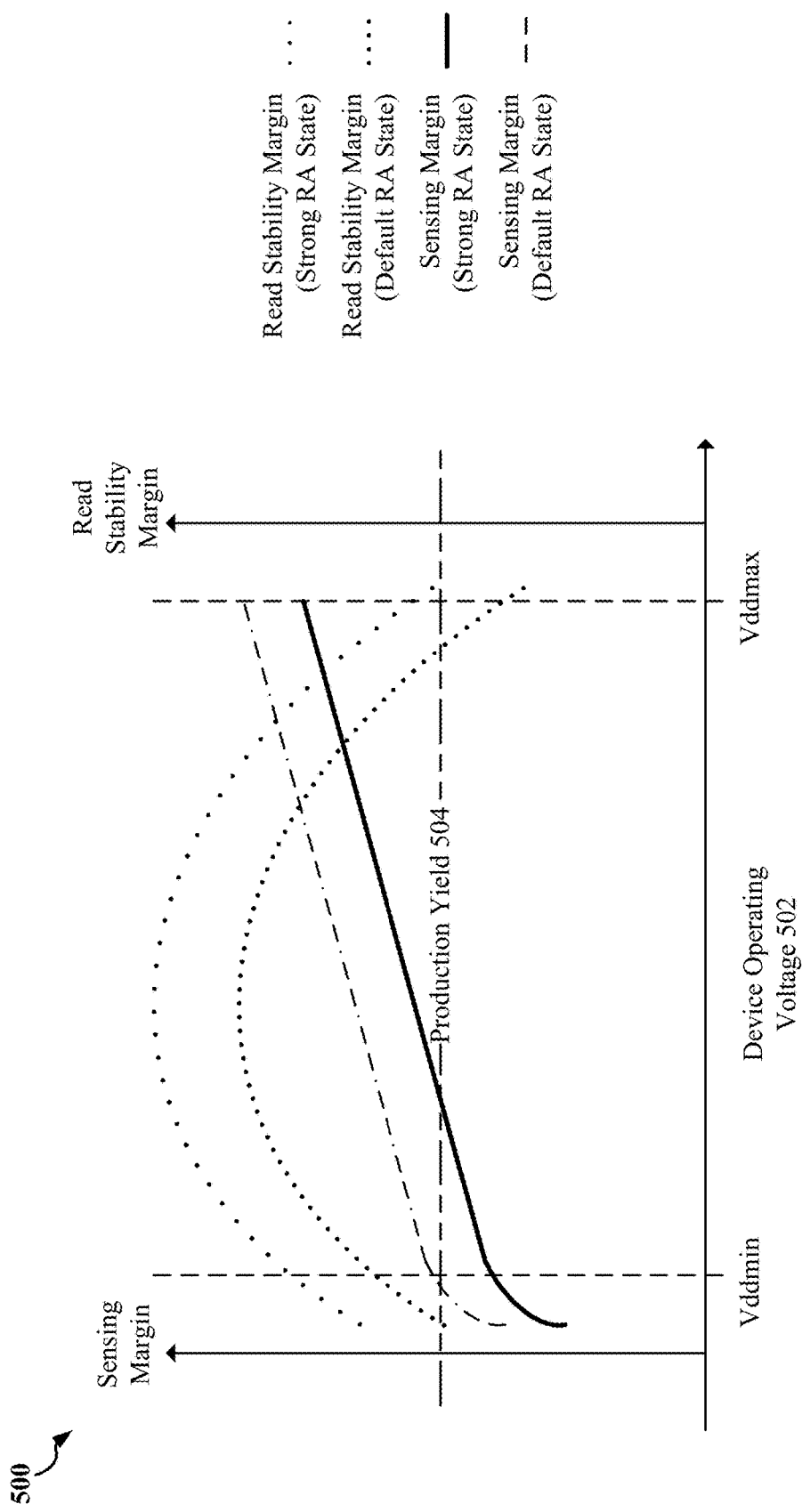
FIG. 5 is a graph illustrating the likelihood of read errors in terms of design tolerances of a device using a read assist circuit.

FIG. 5 is a graph 500 illustrating the likelihood of read errors in terms of design tolerances of a device using a read assist circuit. As shown by FIG. 5, a device operating voltage 502 for a device may be between the operating limits Vdd_min and Vdd_max. While operating within Vdd_min and Vdd_max, two factors may contribute to read errors: sensing margin of the memory, and read stability margin. In order to reduce the likelihood of a read error caused by these two factors, the device may be required to operate above a production yield 504. While operating between Vdd_min and Vdd_max, an assist circuit may be configured to operate in either a default read assist state or a strong read assist state. An assist circuit may be in a strong read assist state when a voltage difference between a WL voltage and a bitcell supply voltage is greater than a first predetermined voltage. For example, in reference to the examples of FIG. 4, the assist circuit 404 may be in a strong read assist state when all of the pull-down transistors 422_1-422_n are enabled such that the voltage on line 450 is 1.5V below Vdd. An assist circuit may be in a default read assist state when a voltage difference between a WL voltage and a bitcell supply voltage is greater than 0 and less than the first predetermined voltage. For example, in reference to the examples of FIG. 4, the assist circuit 404 may be in a default read assist state when only one of the pull-down transistors 422_1-422_n is enabled such that the voltage on line 450 is 0.5V below Vdd. As shown by the graph 500, the sensing margin for a device tends to linearly increase, both in a default or strong read assist state, as the operating voltage 502 increases. However, the sensing margin is below the production yield 504 when the assist circuit is configured in a default read assist state and the device operating voltage 502 is at or near Vdd_min. In comparison, the read stability margin for the device tends to increase as the device operating voltage 502 increases, both in a default or strong read assist state, until a predetermined operating voltage is reached, after which the read stability margin decreases. While the read stability margin tends to remain above the production yield 504, when the assist circuit is arranged in the default read assist state, the sensing margin may drop below the production yield 504 when the device operating voltage 502 is at or near Vdd_max. This means that as Vdd approaches Vdd_min, the sense margin decreases due to the sense amplifier offset voltage (i.e., a reduced Vdd means that a voltage difference being sensed by the sense amplifier may be masked by the sense amp offset voltage). Further, as Vdd increases from Vdd min to Vdd_max the read stability peaks but then declines due to effects of increased current flow in the bitcell lines that may flip bitcell states.

Figure 6:
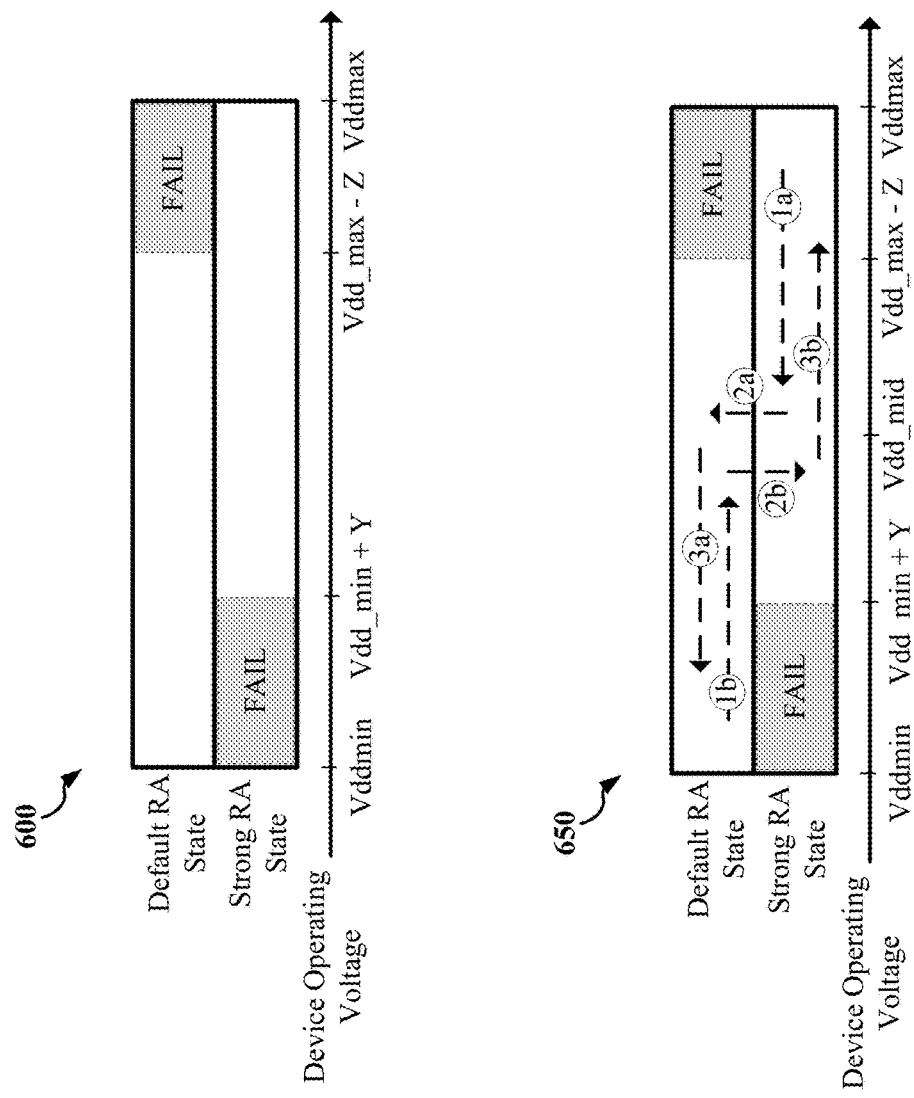
FIG. 6 is a conceptual diagram illustrating examples of when read failure are likely to occur.

FIG. 6 is a conceptual diagram 600 illustrating examples of when read failures are likely to occur. FIG. 6 summarizes the above two factors described above. As shown, read failure may occur when (A) the assist circuit is in a strong read assist state and the device is operating at a device operating voltage Vdd at or near the lower operating limit (i.e., device operating voltage between Vdd_min to Vdd_min+Y), or (B) the assist circuit is in a default read assist state and the device is operating at a device operating voltage Vdd at or near the upper operating limit (i.e., device operating voltage between Vdd_max−Z to Vdd_max). That is, there is a design tolerance of Vdd+/−X (e.g., Vdd_max and Vdd_min) and when the device operating voltage is within a range of Y volts of one of the design tolerances (e.g., Vdd_min) and Z volts of the other design tolerance (e.g., Vdd_max), read errors may be more likely to occur depending on the state of the assist circuit. However, as shown by FIG. 5 there is a range of Vdd for which both read assist states (e.g., strong and default read assist states) do not introduce read errors. Thus to increase the operating voltage Vdd range of the memory when operating at a low Vdd, the read assist may operate in a first state, and when operating at a high Vdd, the read assist may operate in a second state. Further, when transitioning from a low Vdd (e.g., low performance mode) to a high Vdd (e.g., high performance mode), the Vdd is transitioned to a voltage that works for both read assist states before transitioning between read assist states.

Accordingly, the present disclosure provides a technique that may reduce the likelihood of read failure when the assist circuit is in a strong read assist state and the device operating voltage Vdd is within a first voltage range from Vdd_min to Vdd_min+Y, and preventing the assist circuit from being in a default read assist state when the device operating voltage Vdd is within a second voltage range from Vdd_max−Z to Vdd_max. An illustration of the technique is shown by the chart 650 which illustrates how to avoid the first and second voltage ranges where read error is more likely to occur, based on the state of the assist circuit. As shown by chart 650, the device performs the technique when a change in the device operating voltage is performed. For example, the technique may be used when an apparatus is transitioning from a low power mode to a high power mode, or vice versa. As another example, the technique may be used when an application of the apparatus transitions from running in the foreground to running in the background, or vice versa. Using the technique, an intermediate or midrange voltage level Vdd_mid is introduced to help in the transition. As discussed above, the midrange voltage Vdd_mid may be a voltage where both assist states do not have an increased read failure rate. Further, a device may have many memory arrays that have to be transitioned from one read assist state to another read assist state. To reduce timing issues Vdd may be maintained at Vdd_mid for a period of time necessary to propagate the control signals to all the memory arrays. In an example, the device may maintain a strong read assist state of the assist circuit while the device operating voltage is lowered from Vdd_max to the Vdd_mid (1a). The device may then maintain the device operating voltage at Vdd_mid for a predetermined time and then switch the state of the assist circuit to a default assist state (2a). After having switched states of the assist circuit, the device may lower the device operating voltage to Vdd_min (3a). As shown by chart 650, the technique may be used in reverse when transitioning from a low operating voltage (e.g., Vdd_min) to a high operating voltage (Vdd_max), as illustrated by 1b, 2b, and 3b.

Figure 7:
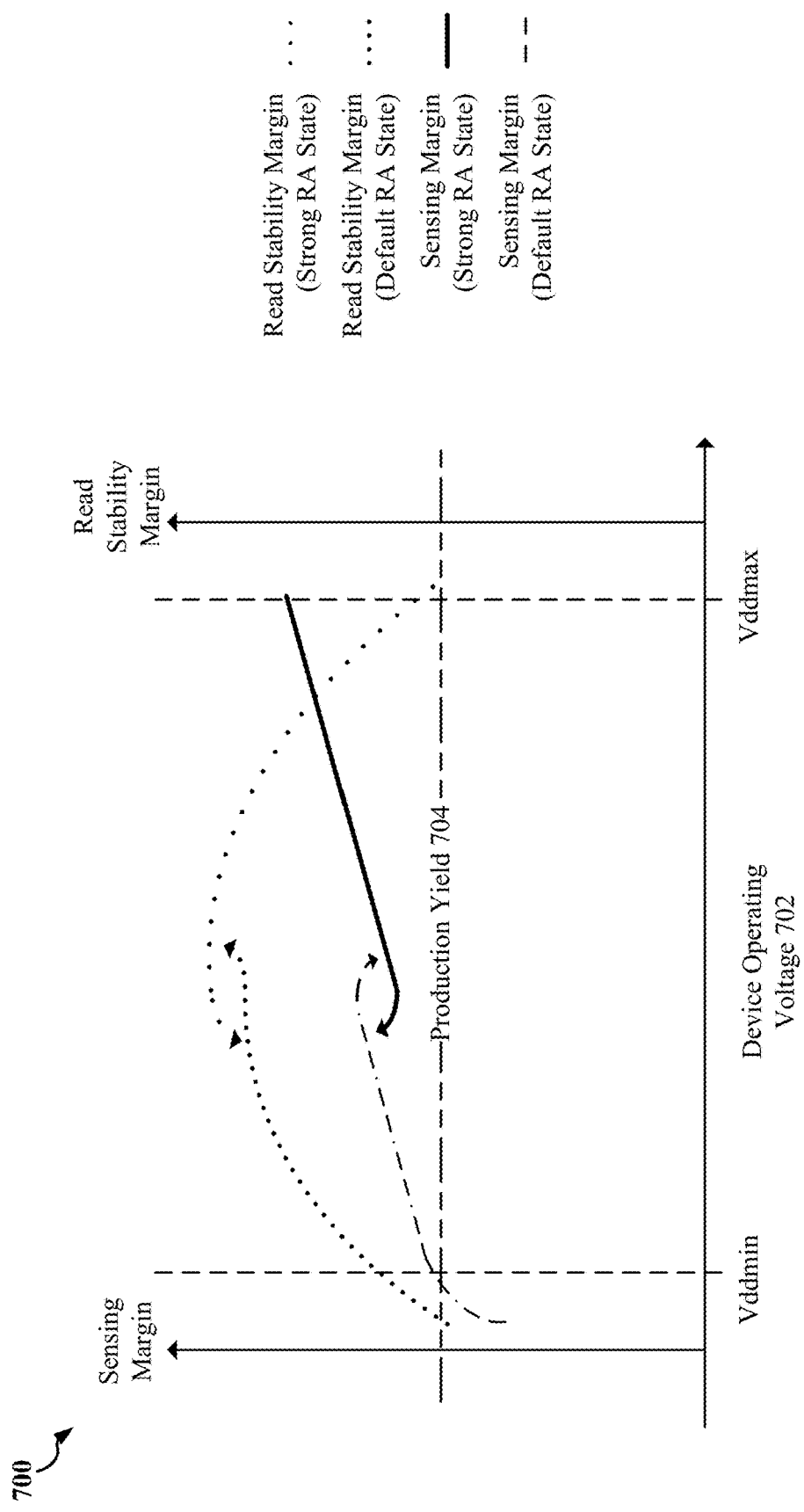
FIG. 7 is conceptual diagram illustrating a state transition performed by an assist circuit.

FIG. 7 is conceptual diagram 700 illustrating a state transition performed by an assist circuit according to an aspect. As shown by FIG. 7, when techniques of the present disclosure are used while a device operating voltage 702 is changed, the sensing margin is improved (i.e., remains above the production yield) because the assist circuit is not configured to be in a strong read assist state when operating at low operating limits (e.g., Vdd_min), the read stability margin may be improved because the assist circuit is not configured to be in a default read assist state when operating at high operating limits (e.g., Vdd_max), and overall read errors may be reduced because the transition occurs at a midrange operating voltage which does not increase the red error rate for either read assist state.

Figure 8:
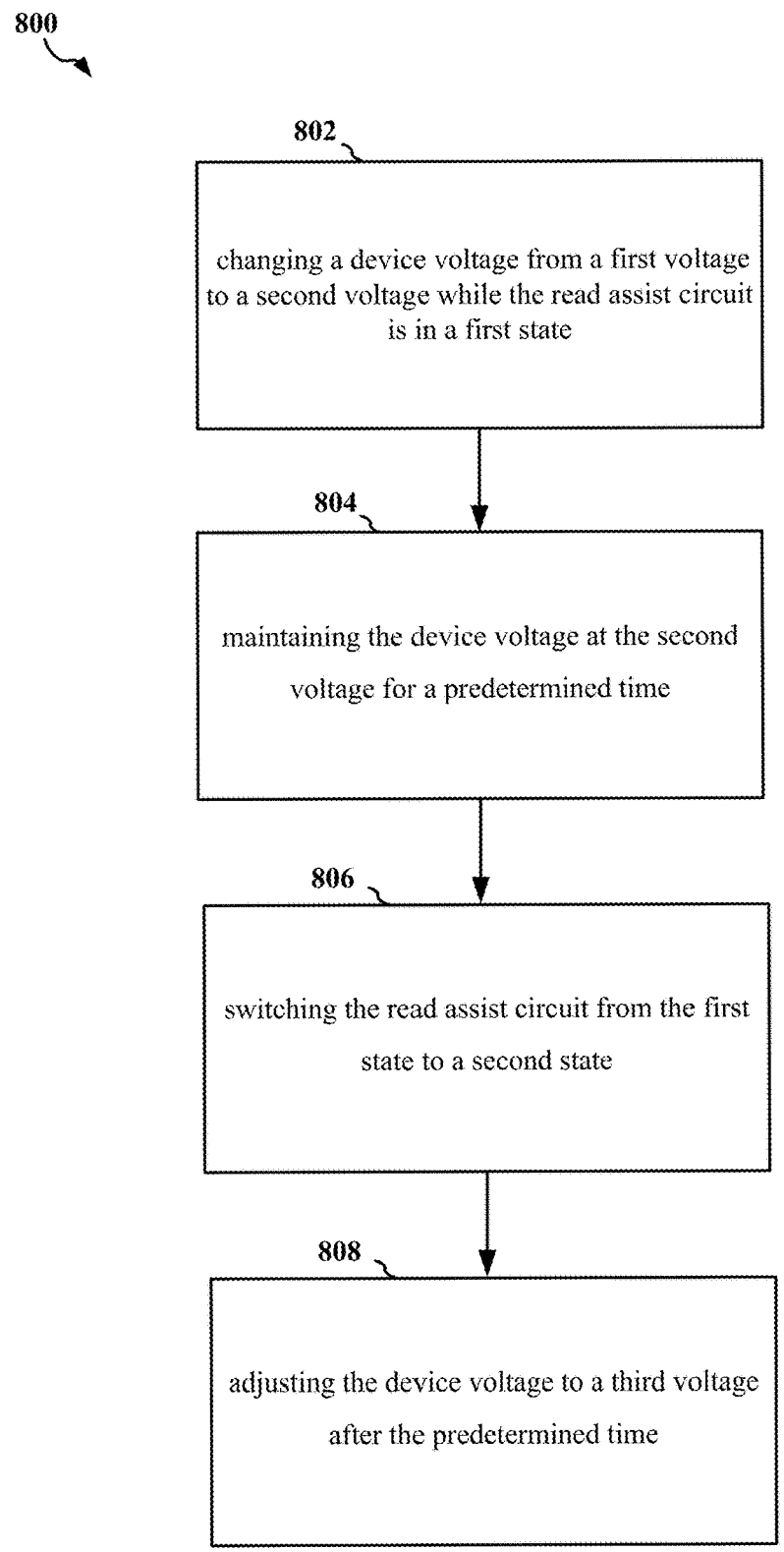
FIG. 8 is a flow chart illustrating a method for performing read assist by an apparatus having an assist circuit according to an aspect.

FIG. 8 is a flow chart 800 illustrating a method for performing read assist by an apparatus having an assist circuit according to an aspect. At 802, the apparatus may change a device operating voltage from a first voltage to a second voltage while the assist circuit is in a first state. For example, the apparatus may switch from a high performance mode to a low performance mode, or vice versa. The device operating voltage may be changed from the first voltage to the second voltage using voltage rails, multiple power supplies, or voltage regulators to adjust the device operating voltage. In some aspects, the device operating voltage may be provided to a WL driver for powering a WL of a memory (e.g., Vdd of WL driver 410), and/or provided to a bitcell for powering inverters in a bitcell (e.g., Vdd of bitcell inverters 222, 224). The first voltage may be associated with a current operating voltage that the device is operating at. For example, the current device operating voltage may be at Vdd_min (e.g., 0.8V) when operating in a normal performance mode or may be at Vdd_max (e.g., 1.2V) when operating in a performance mode. For example, the apparatus or an application on the apparatus may currently be operating at Vdd_max but is transitioning to Vdd_min when access to memory is less frequent such as when the apparatus is placed into a low power mode or the application transitions from running in the foreground to running in the background. As another example, the apparatus or the application on the apparatus may be operating at Vdd_min and is transitioning to Vdd_max when access to memory is frequent such as when the apparatus transitions to a high computational load or the application transitions from running in the background to running in the foreground. Further, in some aspects, the second voltage may correspond to an intermediate voltage that provides a maximum read stability margin of the assist circuit and a stable sense margin. In other words, the second voltage is a voltage where the assist circuit has a low likelihood of read failure in either assist mode. For example, the second voltage may be a midrange voltage of 1.0V. Further, the states (e.g., the first state and second state) of the assist circuit correspond to an arrangement of the components (e.g., pull-down transistors or voltage switches) of the assist circuit to create a voltage difference between a WL voltage and a bitcell voltage of the memory, where the bitcell voltage is greater than the WL voltage. For example, when the assist circuit is in a first state, the components of the assist circuit may be arranged to create a first voltage difference between the WL voltage and the bitcell voltage, and when the assist circuit is in a second state components of the assist circuit may be arranged to create a second voltage difference, different than the first voltage difference. An example of the first state may include the pull-down transistors 422_1-422_n of the assist circuit 404 being arranged such that only one of the pull-down transistors 422_1-422_n is enabled to pull the WL on line 450 down by 0.1V (i.e., the voltage difference between the WL voltage and bitcell voltage is 0.5V), and an example of the second state may include all of the pull-down transistors 422_1-422_n being enabled to pull the WL on line 450 down by 0.2V (i.e., the voltage difference between the WL voltage and bitcell voltage is 0.2V).

At 804, the apparatus may maintain the device operating voltage at the second voltage for a predetermined time. In an example, the apparatus may include a counter which is decremented every . . . and reaches zero at the predetermined time. In some examples, the predetermined amount of time may be a fixed time (e.g., 100 ms). In some examples, the predetermined amount of time may be a delay time or an amount of time needed for a control circuit (e.g., 402) to provide state control signals to control the assist circuit for changing components of the assist circuit from a first arrangement to a second arrangement.

At 806, the apparatus may switch the assist circuit from the first state to a second state. The assist circuit may switch from the first state to the second state by configuring components of the assist circuit to change a current voltage difference between the WL voltage and the bitcell voltage.

For example, pull-down transistors of the assist circuit may be configured to be enabled/disabled to reduce or increase an amount of voltage on a WL and thereby change a voltage difference between the WL voltage and the bitcell voltage. In another example, a voltage driver may be configured to provide the voltage difference to the WL or to inverters of a bitcell, thereby creating the voltage difference.

At 808, the apparatus may adjust the device operating voltage from the second voltage to a third voltage after the predetermined time, wherein the second voltage is a voltage level between the first voltage and the third voltage. The device operating voltage may be changed from the second voltage to the third voltage using voltage rails, multiple power supplies, or voltage regulators to adjust the device operating voltage. As an example, depending on whether the apparatus is transitioning from a low power mode to a high power mode, or vice versa, the device operating voltage may transition from Vdd_mid (e.g., 1.0V) to one of Vdd_max (e.g., 1.2V) or Vdd_min (0.8V), respectively.

By transitioning the device operating voltage from the first voltage to the third voltage while at the same time preventing the assist circuit from entering particular read assist states, the apparatus may reduce a likelihood of read failures occurring when the apparatus is in the low power mode or the high power mode and is transitioned to the other power mode. Further, in doing so, the memory of the apparatus may function over a greater range of voltages with a reduced likelihood of read failures.

Examples of methods of implementing the flow chart 800 are now provided in relation to the integrated circuit 400. In a first example, a device or an application on the device may be transitioning from a high power mode (e.g., high computational load) to a low power mode. In this example, a device operating voltage Vdd, is transitioning from a maximum device operating voltage Vdd_max (e.g., 1.2V) to a minimum device operating voltage Vdd_min (e.g., 0.8V). The device operating voltage may be supplied to the WL driver 410 and to the bitcells (e.g., the inverters 222, 224 of bitcell 200 of FIG. 2). Further, the assist circuit 404 is in a strong read assist state. In this example, the strong read assist state may be a state where all of the pull-down transistors 422_1-422_n are enabled causing a decrease in voltage to the WL voltage on line 450 by a first predetermined amount, which is greater than a second predetermined amount. For example, if the WL voltage is decreased by 0.2V when all of the pull-down transistors 422_1-422_n are enabled, then the current WL voltage is 1.0V (Vdd_max−the first predetermined amount).

To transition the device operating voltage to the low power mode, the control circuit 402 may decrease the device operating voltage from Vdd_max to a midrange voltage Vdd_mid (e.g., 1.0V) while the assist circuit 404 remains in the strong read assist state (802). The control circuit 402 may maintain the device operating voltage at Vdd_mid for a predetermined amount of time (804). In some examples, the predetermined amount of time may be a fixed time that is predetermined by the control circuit 402. In some examples, the predetermined amount of time may be the amount of time needed for the control circuit 402 to provide state control signals to the pull-down transistors 422_1-422_n and disable all but one of the pull-down transistors 422_1-422_n. After the predetermined amount of time, the control circuit 402 may switch the assist circuit 404 from the strong read assist state to a default read assist state (806). In this example, the default read assist state may be state where one of the pull-down transistors 422_1-422_n is enabled causing a decrease in voltage to the WL voltage on line 450 by the second predetermined amount. For example, if the WL voltage is decreased by 0.1V when the one of the pull-down transistors 422_1-422_n is enabled, then the current WL voltage is 1.1V (Vdd_max–the second predetermined amount).

Once the assist circuit 406 has switched states, the control circuit 402 may lower the device operating voltage from Vdd_mid (e.g., 1.0V) to Vdd_min (e.g., 0.8V) while the assist circuit 404 remains in the default read assist state (808).

In a second example, a device or an application on the device may be in a low power mode and is transitioning to a high power mode (e.g., high computational load). In this example, a device operating voltage is transitioning from Vdd_min (e.g., 0.8V) to Vdd_max (e.g., 1.2V). The device operating voltage may be supplied to the WL driver 410 and to the bitcells 222, 224. Further, the assist circuit 404 is in the default read assist state. In this example, the default read assist state may be that one of the pull-down transistors 422_1-422_n is enabled causing a decrease in voltage to the WL voltage on line 450 by the second predetermined amount. For example, if the WL voltage is decreased by 0.1V when the one of the pull-down transistors 422_1-422_n is enabled, then the current WL voltage is 0.7V (Vdd_min–the second predetermined amount).

To transition to the high power mode, the control circuit 402 may increase the device operating voltage from Vdd_min to a midrange voltage Vdd_mid (e.g., 1.0V) while the assist circuit 404 remains in the default read assist state. The control circuit 402 may maintain the device operating voltage at Vdd_mid for a predetermined amount of time (804). In some examples, the predetermined amount of time may be a fixed time that is predetermined by the control circuit 402. In some examples, the predetermined amount of time may be the amount of time needed for the control circuit to provide state control signals for controlling the pull-down transistors 422_1-422_n. After the predetermined amount of time, the control circuit 402 may switch the assist circuit 404 from the default read assist state to a strong read assist state (806). In this example, the strong read assist state may be a state where all of the pull-down transistors 422_1-422_n are enabled causing a decrease in voltage to the WL voltage on line 450 by the first predetermined amount. For example, if the WL voltage is decreased by 0.2V when all of the pull-down transistors 422_1-422_n are enabled, then the current WL voltage is 0.8V (Vdd_mid–the first predetermined amount).

Once the assist circuit 406 has switched states, the control circuit 402 may increase the device operating voltage from Vdd_mid (e.g., 1.0V) to Vdd_max (e.g., 1.2V) while the assist circuit 404 remains in the strong read assist state (808).

While examples of the read assist states (i.e., strong and default) have been described to include the particular arrangements of the pull-down transistors 422_1-422_n, the present disclosure is not limited to these examples and those skilled in the art would readily appreciate that more or fewer transition states, voltage levels and/or assist states may be employed.

Further, while the assist circuit 404 is illustrated using a pull-down transistor scheme, the present disclosure is not limited to such an assist circuit, as will be readily appreciated by those skilled in the art. Other assisted circuits may benefit from the above described control scheme, examples of which are discussed below.

Figure 9:
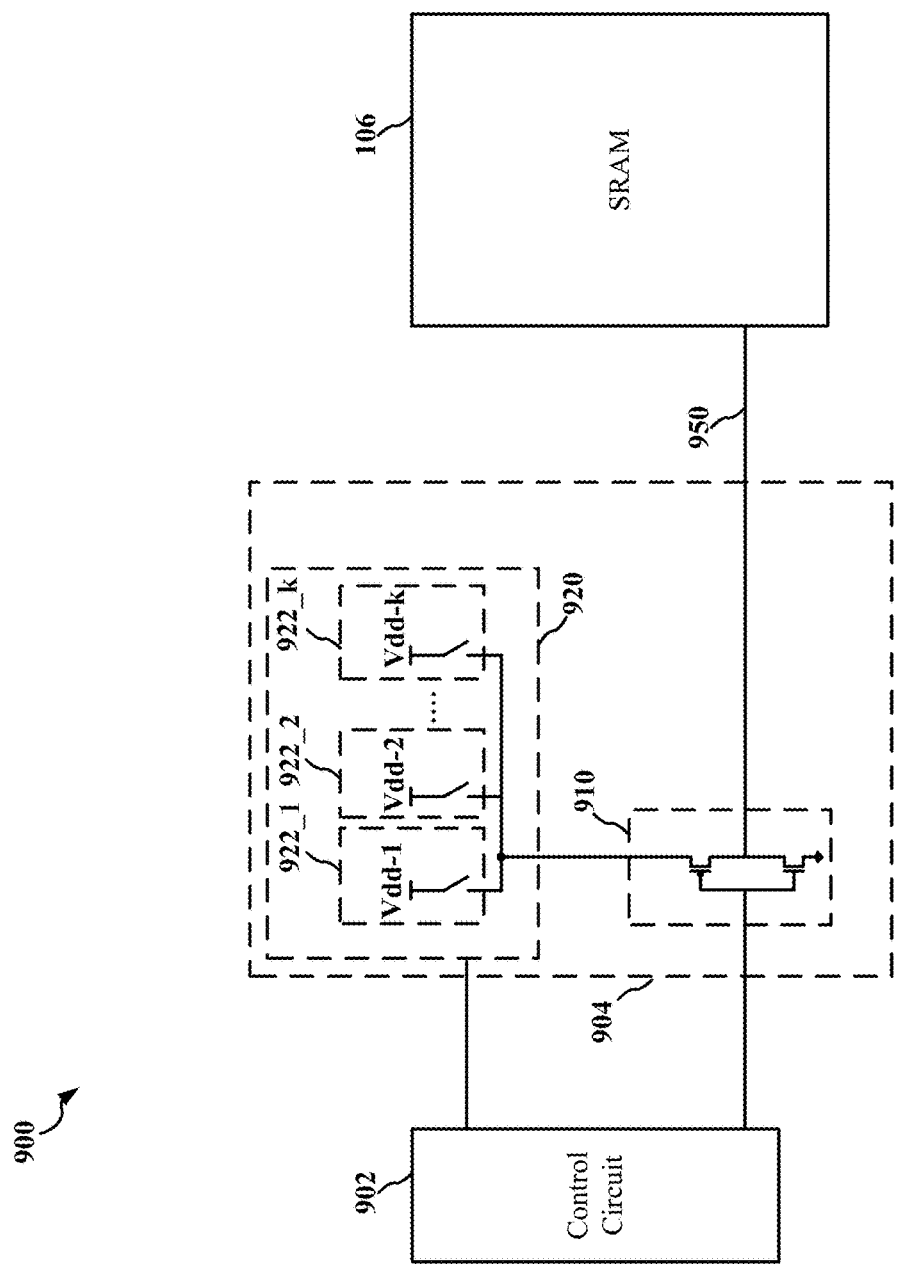
FIG. 9 is a functional block diagram illustrating one example of an integrated circuit.

FIG. 9 is a functional block diagram illustrating one example of an integrated circuit 900. The integrated circuit 900 may be an example of the integrated circuit 100 of FIG. 1. The integrated circuit 900 may include a control circuit 902 coupled to an assist circuit 604 that is coupled to the memory 106. The control circuit 902 may provide control logic to the assist circuit 904, and also provide other functions for controlling the memory 106, such as decoding word line (WL), write enable, output enable, etc. Examples of the control circuit 902 may include the control circuit 102.

The assist circuit 904 may include a WL driver 910 configured to receive an address select signal corresponding to a bitcell from the array of bitcells in the memory 106. An output of the WL driver 910 may be coupled, at line 950, to a WL of memory 106. The assist circuit 904 may also include a voltage level circuit 920 that provides a voltage to the WL driver 910. The voltage level circuit 920 may include a plurality of switches 922_1-922_k, where k is any integer. In an example, the plurality of switches 922_1-922_k may be n-channel or p-channel transistors. The voltage level circuit 920 may be controlled by the control circuit 902. For example, the control circuit 902 may be configured to transmit control signals to the voltage level circuit 920 to select a particular Vdd level, or the control circuit 902 may be configured to write to a register a value that enables the particular Vdd level.

Each of the plurality of switches 922_1-922_k may be coupled to a different voltage (e.g., Vdd–1-Vdd–k). One of the plurality of switches 922_1-922_k may be enabled at a time. The voltage from the enabled switch may be provided to the WL driver 910, and therefore may be the WL voltage on line 950. The voltages Vdd–1-Vdd–k may be provided by a plurality of power sources external to the integrated circuit 900. Further, each of the voltages Vdd–1-Vdd–k may be equal to the device operating voltage Vdd–a predetermined voltage decrease. For example, if Vdd is 1.2V and each voltage decrease is 0.0.1V, Vdd–1 may be 1.1V, Vdd–2 may be 1.0V, Vdd–3 may be 0.9V, etc. However, while the example shows that each voltage (e.g., Vdd–1-Vdd–k) is decreased by a fixed voltage amount (e.g., 0.0.1V), those skilled in the art would readily appreciate that aspects of the present application are not limited to a fixed decremented amount and may instead be any decrease of voltage between each of the voltages Vdd–1-Vdd–k.

Examples of methods implementing the flow chart 800 are now provided in relation to the integrated circuit 900. In these examples, assist circuit 904 may be configured in a strong read assist state and a default read assist state, where the strong read assist state may be a state where one of the plurality of switches 922_1-922_k is enabled to provide a first predetermined voltage to the WL driver 910, where the first predetermined voltage is less than a second predetermined voltage which is less than Vdd, and where the default read assist state may be a state where t another one of the plurality of switches 922_1-922_k is enabled to provide the second predetermine voltage. For simplicity, this example will refer to Vdd-k as providing the first predetermined voltage having a kth voltage decrease of 0.2V under Vdd, and Vdd–1 as providing the second predetermined voltage having a first voltage decrease of 0.1V under Vdd.

In a first example, a device or an application on the device may be transitioning from a high power mode (e.g., high computational load) to a low power mode. In this example, a device operating voltage Vdd, is transitioning from Vdd_max (e.g., 1.2V) to Vdd_min (e.g., 0.8V). The device operating voltage Vdd may be supplied to the bitcells 222, 224. Further, the assist circuit 904 is configured in the strong read assist state. Therefore, in this example, when switch 922_*k* is enabled, the current WL voltage on line 950 is 1.0V (Vdd_max−the kth voltage decrease).

To transition the device operating voltage to a low power mode, the control circuit 902 may lower the device operating voltage from Vdd_max to a midrange voltage Vdd_mid (e.g., 4.0V) while the assist circuit 904 remains in the strong read assist state. The control circuit 902 may maintain the device operating voltage at Vdd_mid for a predetermined amount of time (804). In some examples, the predetermined amount of time may be a fixed time that is predetermined by the control circuit 902. In some examples, the predetermined amount of time may be the amount of time needed for the control circuit to provide state control signals for controlling the plurality of switches 922_1-922_*k* for disabling all but one of the plurality of switches 922_1-922_*k*. After the predetermined amount of time, the control circuit 902 may switch the assist circuit 904 from the strong read assist state to a default read assist state (806). Therefore, in this example, when switch 922_1 is enabled, the current WL voltage on line 950 is 3.5V (i.e., Vdd_mid−the first voltage decrease). Once the assist circuit 904 has switched states, the control circuit 902 may lower the device operating voltage from Vdd_mid (e.g., 1.0V) to a Vdd_min (e.g., 0.8V) while the assist circuit 904 remains in the default read assist state (808).

In a second example, a device or an application on the device may be in a low power mode and is transitioning to a high power mode (e.g., high computational load). In this example, a device operating voltage Vdd is transitioning from Vdd_min (e.g., 0.8V) to Vdd_max (e.g., 1.2V). The device operating voltage may be supplied to the bitcells 222, 224. Further, the assist circuit 904 is in a default read assist state. Therefore, in this example, when switch 922_1 is enabled, the current WL voltage on line 950 is 0.7V (Vdd_min−the first voltage decrease).

To transition the device operating voltage to the high power mode, the control circuit 902 may increase the device operating voltage from Vdd_min to a midrange voltage Vdd_mid (e.g., 4.0V) while the assist circuit 904 remains in the default read assist state. The control circuit 902 may maintain the device operating voltage at Vdd_mid for a predetermined amount of time (804). In some examples, the predetermined amount of time may be a fixed time that is predetermined by the control circuit 902. In some examples, the predetermined amount of time may be the amount of time needed for the control circuit 902 to for controlling the plurality of switches 922_1-922_*k*. After the predetermined amount of time, the control circuit 902 may switch the assist circuit 904 from the default read assist state to a strong read assist state (806). Therefore, in this example, the switch 922_*k* is enabled causing the current WL voltage on line 950 to be 2.5V (i.e., Vdd_mid−the kth voltage decrease). Once the read assist circuit 904 has switched states, the control circuit 902 may increase the device operating voltage from Vdd_mid (e.g., 1.0V) to Vdd_max (e.g., 1.2V) while the assist circuit 904 remains in the strong read assist state (808).

While the previous examples relating to FIGS. 4 and 9 describe a read assist scheme where the WL voltage is lowered in comparison to the device operating voltage Vdd provided to the bitcell 222, 224, aspects of the present application are not limited to this read assist scheme, and may include a read assist scheme that raises the bitcell voltage in comparison to the WL voltage.

Figure 10:
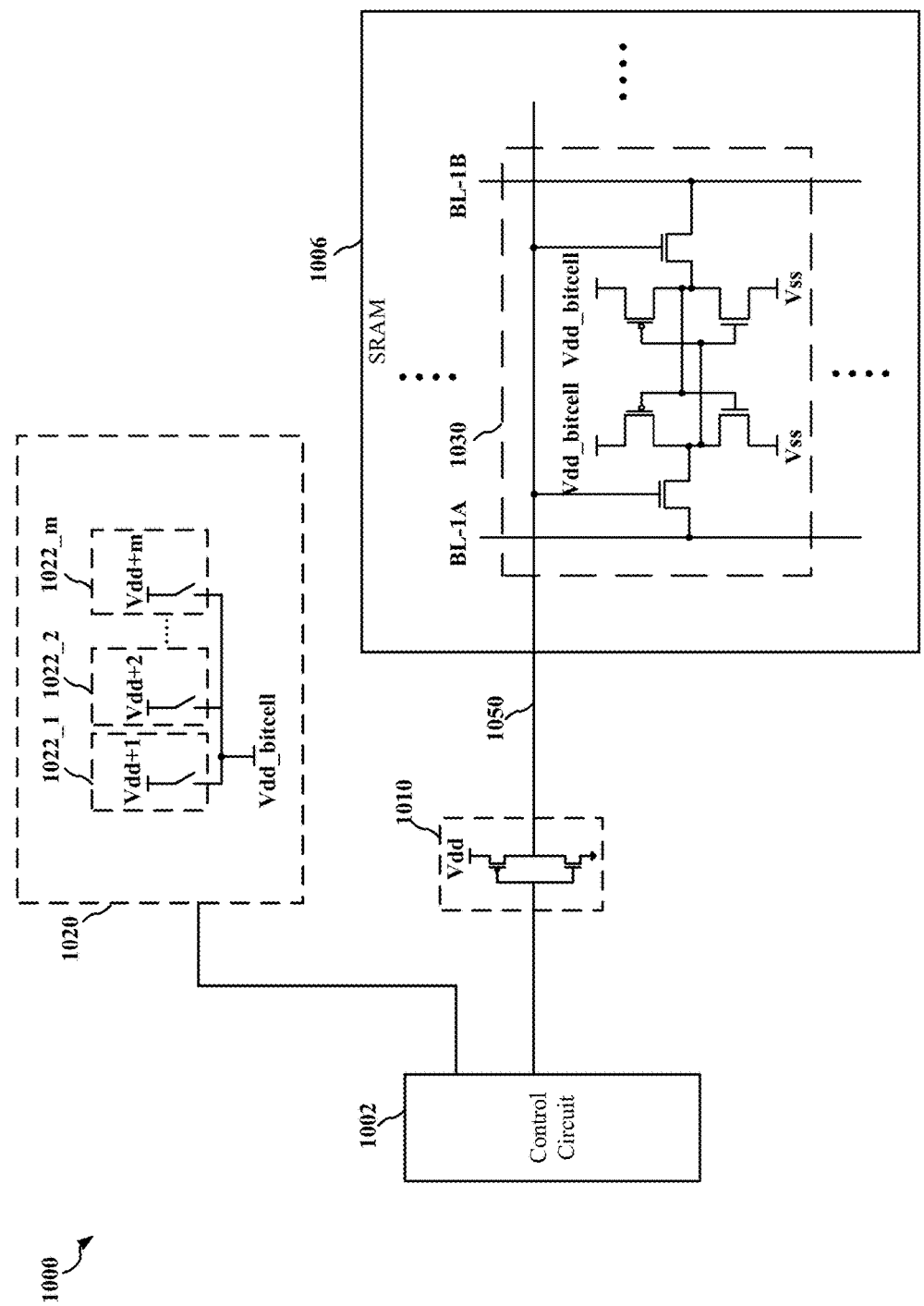
FIG. 10 is a functional block diagram illustrating an example of an integrated circuit.

FIG. 10 is a functional block diagram illustrating an example of an integrated circuit 1000. The integrated circuit 1000 may be an example of the integrated circuit 100 of FIG. 1. The integrated circuit 1000 may include a control circuit 1002 coupled to an WL driver 1010 that is coupled to a memory 1006. As shown by FIG. 10, the control circuit 1002 may also be coupled to the assist circuit 1020. The control circuit 1002 may provide control logic to the WL driver 1010, and also provide other functions for controlling the memory 1006, such as decoding word line (WL), write enable, output enable, etc. Examples of the control circuit 1002 may include the control circuit 102 or a processor and/or control logic circuits configured to provide control signals to the assist circuit 1004 and/or the memory 1006. The memory 1006 may include static random access memory (SRAM). The memory 1006 may include an array of bitcells, where the array is arranged in rows and columns of bitcells, as discussed above for memory 106 for FIG. 1. However, Vdd for the memory 1006 may be controlled by the assist circuit 1020, as described below.

The WL driver 1010 may be configured to receive an address select signal corresponding to a bitcell (e.g., 1030) from the array of bitcells in the memory 1006. An output of the WL driver 1010 may be coupled, at line 1050, to a WL of the memory 1006.

The assist circuit 1020 may include a plurality of switches 1022_1-1022_*m*, where m is any integer. In an example, the plurality of switches 1022_1-1022_*m* may be n-channel or p-channel transistors. Each of the plurality of switches 1022_1-1022_*m* may be controlled by the control circuit 1002. For example, the control circuit 1002 may be configured to transmit control signals to the assist circuit 1020 to select a particular Vdd level, or the control circuit 1002 may be configured to write to a register a value that enables the particular Vdd level. Each of the plurality of switches 1022_1-1022_*m* may be coupled to a different voltage (e.g., Vdd+1-Vdd+m). One of the plurality of switches 1022_1-1022_*m* may be enabled at a time. The voltage from the enabled switch may be provided to Vdd_bitcell of a bitcell 1030. The voltage may raise the bitcell voltage above the Vdd and WL voltage. The voltages Vdd+1-Vdd+m may be provided by a plurality of power sources external to the integrated circuit 1000. Further, each of the voltages Vdd+1-Vdd+m may be equal to the device operating voltage Vdd+a predetermined voltage increase. For example, if Vdd is 1.2V and each voltage increase is 0.1V, the voltage Vdd+1 may be 5.1V (Vdd+the first voltage increase), the voltage Vdd+2 may be 5.2V (Vdd+the second voltage increase), etc. However, while the example shows that each voltage (e.g., Vdd+1-Vdd+m) is increased by a fixed voltage amount (e.g., 0.1V), those skilled in the art would readily appreciate that aspects of the present application are not limited to a fixed incremented amount and may instead be any increase of voltage between each of the voltages Vdd+1-Vdd+m.

Examples of methods implementing the flow chart 800 are now provided in relation to the integrated circuit 1000. In these examples, assist circuit 1020 may be configured for a strong read assist state and a default read assist state, where the strong read assist state may be a state where a first switch of the plurality of switches 1022_1-1022_*m* is enabled to provide a first predetermined voltage to bitcell 1030, where the first predetermined voltage is greater than a second predetermined voltage which is greater than Vdd, and where the default read assist state may be a state where a second switch of the plurality of switches 1022_1-1022_*m* is enabled to provide the second predetermine voltage. For simplicity, this example will refer to Vdd+m as providing the first predetermined voltage having a mth voltage increase of 0.2V over Vdd, and Vdd+1 as providing the second predetermined voltage having a first voltage increase of 0.1V over Vdd.

In a first example, a device or an application on the device may be transitioning from a high power mode (e.g., high computational load) to a low power mode. In this example, a device operating voltage Vdd, is transitioning from a Vdd_max (e.g., 1.2V) to Vdd_min (e.g., 0.8V). The device operating voltage may be supplied to the WL driver 1010. Further, the assist circuit 1020 is in a strong read assist state. Therefore, in this example, when the switch 1022_m is enabled, the current bitcell voltage Vdd_bitcell is 1.4V (Vdd_max+the mth voltage increase) while the WL voltage is 1.2V (Vdd_max).

To transition to the lower power mode, the control circuit 1002 may lower the device operating voltage from Vdd_max to Vdd_mid (e.g., 1.0V) while the assist circuit 1020 remains in the strong read assist state (802). The control circuit 1002 may maintain the device operating voltage at Vdd_mid for a predetermined amount of time (804). In some examples, the predetermined amount of time may be a fixed time that is predetermined by the control circuit 1002. In some examples, the predetermined amount of time may be the amount of time needed for the control circuit 1002 for controlling the plurality of switches 1022_1-1022_m. After the predetermined amount of time, the control circuit 1002 may switch the assist circuit 1020 from the strong read assist state to a default read assist state (806). Therefore, in this example, when the switch 1022_1 is enabled, the current bitcell voltage Vdd_bitcell is 1.1V (Vdd_mid+the first voltage increase) while the WL voltage is 1.0V (Vdd_mid). Once the read assist circuit 1020 has been switched, the control circuit 1002 may lower the device operating voltage from Vdd_mid (e.g., 1.0V) to Vdd_min (e.g., 0.8V) while the assist circuit 1020 remains in the default read assist state (808).

In a second example, a device or an application on the device may be in a low power mode and is transitioning to a high power mode (e.g., high computational load). In this example, a device operating voltage is transitioning from Vdd_min (e.g., 0.8V) to Vdd_max (e.g., 1.2V). The device operating voltage may be supplied to the WL driver 1010. Further, the assist circuit 1020 is in a default read assist state. Therefore, in this example, when the switch 1022_1 is enabled, the current bitcell voltage Vdd_bitcell is 0.9V (Vdd_min+the first voltage increase) while the WL voltage is 0.8V (Vdd_min).

To transition the device operating voltage to the high power mode, the control circuit 1002 may increase the device operating voltage from Vdd_min to Vdd_mid (e.g., 1.0V) while the assist circuit 1020 remains in the default read assist state. The control circuit 1002 may maintain the device operating voltage at Vdd_mid for a predetermined amount of time (704). In some examples, the predetermined amount of time may be a fixed time that is predetermined by the control circuit 1002. In some examples, the predetermined amount of time may be the amount of time needed for the control circuit 1002 for controlling the plurality of switches 1022_1-1022_m. After the predetermined amount of time, the control circuit 1002 may switch the assist circuit 1020 from the default read assist state to a strong read assist state (806). Therefore, in this example, when the switch 1022_m is enabled, the current bitcell voltage Vdd_bitcell is 1.2V (Vdd_mid+the mth voltage increase) while the WL voltage is 1.0V (Vdd_mid). Once the assist circuit 1020 has been switched, the control circuit 1002 may increase the device operating voltage from Vdd_mid (e.g., 1.0V) to Vdd_max (e.g., 1.2V) while the assist circuit 1020 remains in the strong read assist state (808).

Figure 11:
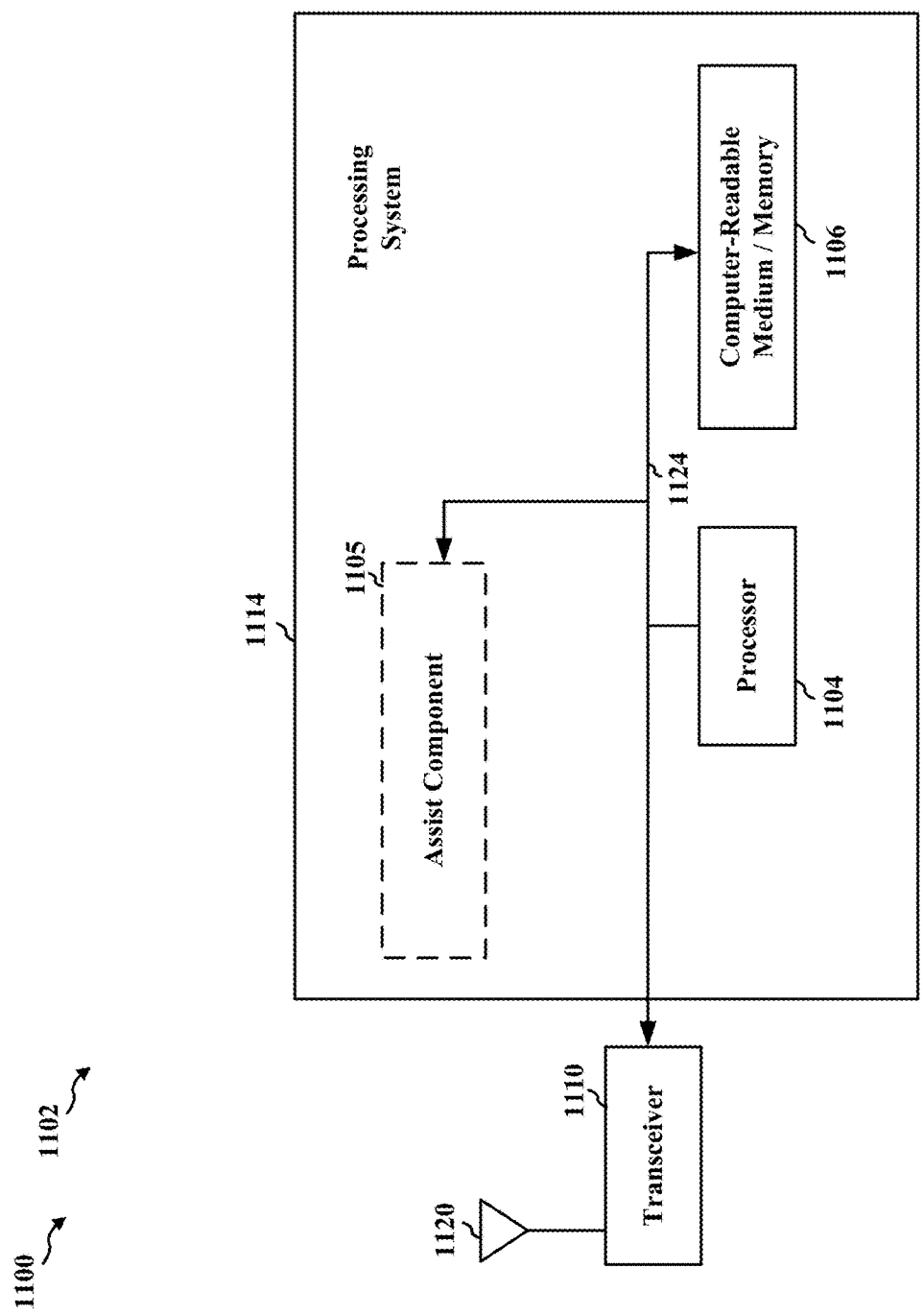
FIG. 11 is a diagram illustrating an example of a hardware implementation for an apparatus.

FIG. 11 is a diagram 1100 illustrating an example of a hardware implementation for an apparatus 1102 employing a processing system 1114. The processing system 1114 may be implemented with a bus architecture, represented generally by the bus 1124. The bus 1124 may include any number of interconnecting buses and bridges depending on the specific application of the processing system 1114 and the overall design constraints. The bus 1124 links together various circuits including one or more processors and/or hardware components, represented by the processor 1104, the assist component 1105, and the computer-readable medium/memory 1106. The bus 1124 may also link various other circuits such as timing sources, peripherals, voltage regulators, and power management circuits, which are well known in the art, and therefore, will not be described any further.

The processing system 1114 may be coupled to a transceiver 1110. The transceiver 1110 may be coupled to one or more antennas 1120. The transceiver 1110 may provide a means for communicating with various other apparatus over a transmission medium. The transceiver 1110 may receive a signal from the one or more antennas 1120, extracts information from the received signal, and may provide the extracted information to the processing system 1114. In addition, the transceiver 1110 receives information from the processing system 1114, and based on the received information, generates a signal to be applied to the one or more antennas 1120. The processing system 1114 includes a processor 1104 coupled to a computer-readable medium/memory 1106. The processor 1104 is responsible for general processing, including the execution of software stored on the computer-readable medium/memory 1106. The software, when executed by the processor 1104, causes the processing system 1114 to perform the various functions described supra for any particular apparatus. The computer-readable medium/memory 1106 may also be used for storing data that is manipulated by the processor 1104 when executing software. The processing system 1114 may further include the assist component 1105. The assist component 1105 may provide assistance to the memory 1106 during read operations. Examples of the assist component 1105 may include the assist circuits 104, 404, 904, or 1020. As another example, the assist component 1105 may be software components running in the processor 1104, resident/stored in the computer readable medium/memory 1106, one or more hardware components coupled to the processor 1104, or some combination thereof. The apparatus 1102 may include the integrated circuit 100. Examples of the apparatus 1102 may include a cellular phone, a personal digital assistant (PDA), laptop computer, a desktop computer (PC), a computer peripheral device, a multimedia device, a video device, an audio device, a global positioning system (GPS), a wireless sensor, or any other suitable device.

In one configuration, the apparatus 1102 includes means for changing a device operating voltage from a first voltage to a second voltage while an assist circuit of the apparatus is in a first state. The apparatus 1102 may also include means for maintaining the device operating voltage at the second voltage for a predetermined time. The apparatus 1102 may further include means for switching the assist circuit from the first state to a second state. The apparatus may include means for adjusting the device operating voltage to a third voltage after the predetermined time, wherein the second voltage is a voltage level between the first voltage and the third voltage. The aforementioned means may be one or more of the aforementioned components of the apparatus 1102 and/or the processing system 1114 of the apparatus 1102 configured to perform the functions recited by the aforementioned means.

Aspects of the disclosure are further directed to an apparatus, such as a cellular phone, a personal digital assistant (PDA), laptop computer, a desktop computer (PC), a computer peripheral device, a multimedia device, a video device, an audio device, a global positioning system (GPS), a wireless sensor, or an Internet of Things device incorporating the processor 1104, the assist component 1105, and the memory 1106.

The various aspects of this disclosure are provided to enable one of ordinary skill in the art to practice aspects of the disclosure. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method for performing read assist for a memory of an apparatus, comprising:
    changing a device operating voltage from a first voltage to a second voltage while an assist circuit of the apparatus is in a first state;
    maintaining the device operating voltage at the second voltage for a predetermined time;
    switching the assist circuit from the first state to a second state; and
    adjusting the device operating voltage to a third voltage after the predetermined time,
    wherein the second voltage is a voltage level between the first voltage and the third voltage.

2. The method of claim 1, wherein the predetermined time is based on a delay time of a state control signal provided to the assist circuit.

3. The method of claim 2, wherein the assist circuit comprises a plurality of pull-down transistors for lowering a word line voltage in comparison to a bitcell voltage and the state control signal includes bit values for controlling the plurality of pull-down transistors.

4. The method of claim 3, wherein one of the first state or the second state is a state in which the plurality of pull-down transistors are all enabled.

5. The method of claim 1, wherein the second voltage is associated with a maximum read stability margin of the assist circuit.

6. The method of claim 1, wherein the first state and the second state of the assist circuit correspond to a first voltage difference and a second voltage difference between a word line voltage and a bitcell voltage of the memory.

7. The method of claim 1, wherein the assist circuit comprises a plurality of switches for providing a voltage to one of a word line or a bitcell of the memory.

8. An apparatus for performing read assist for a memory, comprising:
    means for changing a device operating voltage from a first voltage to a second voltage while an assist circuit of the apparatus is in a first state;
    means for maintaining the device operating voltage at the second voltage for a predetermined time;
    means for switching the assist circuit from the first state to a second state; and
    means for adjusting the device operating voltage to a third voltage after the predetermined time,
    wherein the second voltage is a voltage level between the first voltage and the third voltage.

9. The apparatus of claim 8, wherein the predetermined time is based on a delay time of a state control signal provided to the assist circuit.

10. The apparatus of claim 9, wherein the assist circuit comprises a plurality of pull-down transistors for lowering a word line voltage in comparison to a bitcell voltage and the state control signal includes bit values for controlling the plurality of pull-down transistors.

11. The apparatus of claim 10, wherein one of the first state or the second state is a state in which the plurality of pull-down transistors are all enabled.

12. The apparatus of claim 8, wherein the second voltage is associated with a maximum read stability margin of the assist circuit.

13. The apparatus of claim 8, wherein the first state and the second state of the assist circuit correspond to a first voltage difference and a second voltage difference between a word line voltage and a bitcell voltage of the memory.

14. The apparatus of claim 8, wherein the assist circuit comprises a plurality of switches for providing a voltage to one of a word line or a bitcell of the memory.

15. An apparatus for performing read assist, comprising:
a memory;
at least one processor coupled to the memory and configured to:
change a device operating voltage from a first voltage to a second voltage while an assist circuit of the apparatus is in a first state;
maintain the device operating voltage at the second voltage for a predetermined time;
switch the assist circuit from the first state to a second state; and
adjust the device operating voltage to a third voltage after the predetermined time,
wherein the second voltage is a voltage level between the first voltage and the third voltage.

16. The apparatus of claim 15, wherein the predetermined time is based on a delay time of a state control signal provided to the assist circuit.

17. The apparatus of claim 16, wherein the assist circuit comprises a plurality of pull-down transistors for lowering a word line voltage in comparison to a bitcell voltage and the state control signal includes bit values for controlling the plurality of pull-down transistors.

18. The apparatus of claim 17, wherein one of the first state or the second state is a state in which the plurality of pull-down transistors are all enabled.

19. The apparatus of claim 15, wherein the second voltage is associated with a maximum read stability margin of the assist circuit.

20. The apparatus of claim 15, wherein the first state and the second state of the assist circuit correspond to a first voltage difference and a second voltage difference between a word line voltage and a bitcell voltage of the memory.

21. The apparatus of claim 15, wherein the assist circuit comprises a plurality of switches for providing a voltage to one of a word line or a bitcell of the memory.

22. The apparatus of claim 15, further comprising one of a cellular phone, a personal digital assistant (PDA), laptop computer, a desktop computer (PC), a computer peripheral device, a multimedia device, a video device, an audio device, a global positioning system (GPS), a wireless sensor, or an Internet of Things device incorporating the memory and the at least one processor.

23. A computer-readable medium storing computer executable code for performing read assist for a memory of an apparatus, comprising code for:
changing a device operating voltage from a first voltage to a second voltage while an assist circuit of the apparatus is in a first state;
maintaining the device operating voltage at the second voltage for a predetermined time;
switching the assist circuit from the first state to a second state; and
adjusting the device operating voltage to a third voltage after the predetermined time,
wherein the second voltage is a voltage level between the first voltage and the third voltage.

24. The computer-readable medium of claim 23, wherein the predetermined time is based on a delay time of a state control signal provided to the assist circuit.

25. The computer-readable medium of claim 24, wherein the assist circuit comprises a plurality of pull-down transistors for lowering a word line voltage in comparison to a bitcell voltage and the state control signal includes bit values for controlling the plurality of pull-down transistors.

26. The computer-readable medium of claim 25, wherein one of the first state or the second state is a state in which the plurality of pull-down transistors are all enabled.

27. The computer-readable medium of claim 23, wherein the second voltage is associated with a maximum read stability margin of the assist circuit.

28. The computer-readable medium of claim 23, wherein the first state and the second state of the assist circuit correspond to a first voltage difference and a second voltage difference between a word line voltage and a bitcell voltage of the memory.

29. The computer-readable medium of claim 23, wherein the assist circuit comprises a plurality of switches for providing a voltage to one of a word line or a bitcell of the memory.

* * * * *